US007170427B2

(12) United States Patent
Hsu

(10) Patent No.: US 7,170,427 B2
(45) Date of Patent: Jan. 30, 2007

(54) REMOTE CONTROLLER WITH A PRESSABLE CASING FOR PERFORMING SPECIFIC FUNCTION

(75) Inventor: Ching-Chang Hsu, Panchiao (TW)

(73) Assignee: Hannspree, Inc., Taipei (TW)

( * ) Notice: Subject to any disclaimer, the term of this patent is extended or adjusted under 35 U.S.C. 154(b) by 185 days.

(21) Appl. No.: 11/028,419

(22) Filed: Dec. 30, 2004

(65) Prior Publication Data

US 2006/0145910 A1 Jul. 6, 2006

(51) Int. Cl.
*H03M 11/00* (2006.01)

(52) U.S. Cl. .......................... 341/20; 361/680; 341/34; 341/176; 400/492

(58) Field of Classification Search ................ 341/173, 341/176, 20, 22, 34; 361/680; 400/492; 345/168
See application file for complete search history.

(56) References Cited

U.S. PATENT DOCUMENTS

| | | | | |
|---|---|---|---|---|
| 5,661,505 | A * | 8/1997 | Livits | 345/169 |
| 5,951,179 | A * | 9/1999 | Zarek | 400/492 |
| 6,256,018 | B1 * | 7/2001 | Zarek | 345/168 |
| 6,628,508 | B2 * | 9/2003 | Lieu et al. | 361/680 |

* cited by examiner

*Primary Examiner*—Albert K. Wong
(74) *Attorney, Agent, or Firm*—Ladas & Parry LLP

(57) ABSTRACT

A remote controller includes a casing, a support seat, an actuator, and a control circuit. The support seat has a base, and a post that extends from the base and into the casing and that is pivoted to the casing so as to permit the casing to be tiltable relative to the support seat from a horizontal position to an inclined position. The actuator is mounted on the post within the casing. The control circuit is mounted in the casing, and is co-tiltable with the casing relative to the actuator in such a manner that the control circuit is actuated by the actuator when the casing is disposed at the inclined position.

8 Claims, 5 Drawing Sheets

REMOTE CONTROLLER WITH A PRESSABLE CASING FOR PERFORMING SPECIFIC FUNCTION

BACKGROUND OF THE INVENTION

1. Field of the Invention

The invention relates to a remote controller, more particularly to a remote controller that is operable by tilting the same.

2. Description of the Related Art

FIG. 1 illustrates a conventional remote controller 1 that includes a casing 10 and a plurality of function keys 11.

The aforementioned conventional remote controller 1 is disadvantageous in that the user is easily confused by the large number of function keys 11. As a result, the user may not be able to locate instantly the desired function key 11. Moreover, since the function keys 11 are disposed proximate to each other, the user frequently mistakenly presses a function key 11 adjacent to the desired function key 11.

SUMMARY OF THE INVENTION

Therefore, the object of the present invention is to provide a remote controller that is capable of overcoming the aforementioned drawbacks of the prior art.

According to the present invention, a remote controller includes a casing, a support seat, an actuator, and a control circuit. The remote controller is operable so as to transmit different control signals. The support seat has a base and a post. The base of the support seat is disposed underneath the casing and is adapted to be laid on a horizontal surface. The post of the support seat extends upwardly from the base through and into the casing and is pivoted to the casing so as to permit the casing to be tiltable relative to the support seat from a horizontal position to an inclined position. The actuator is mounted on the post within the casing. The control circuit, which generates the control signals, is mounted in the casing. The control circuit is co-tiltable with the casing relative to the actuator in such a manner that the control circuit is actuated by the actuator so as to generate a corresponding one of the control signals when the casing is disposed at the inclined position.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
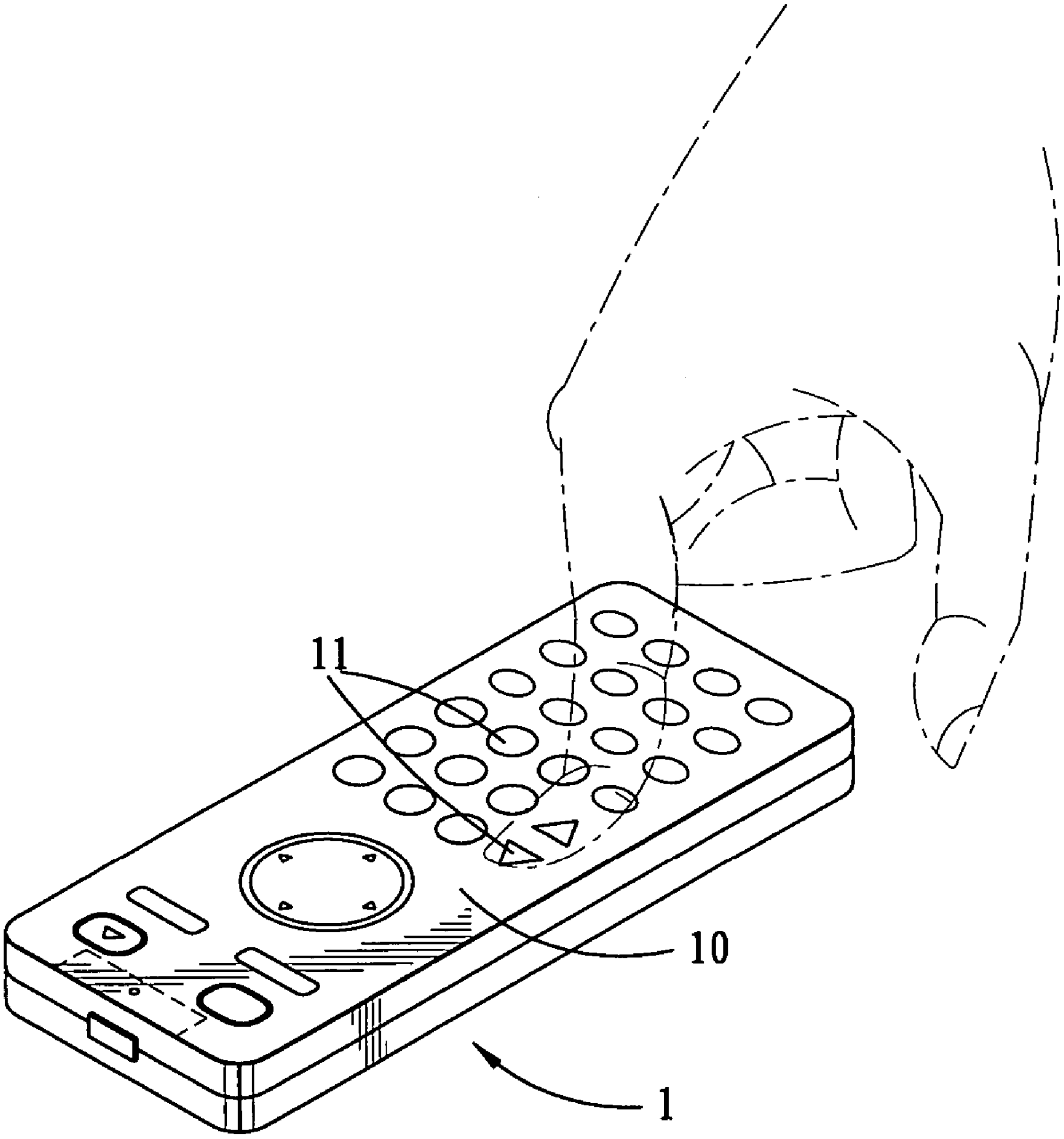
FIG. 1 is a perspective view of a conventional remote controller.
Figure 2:
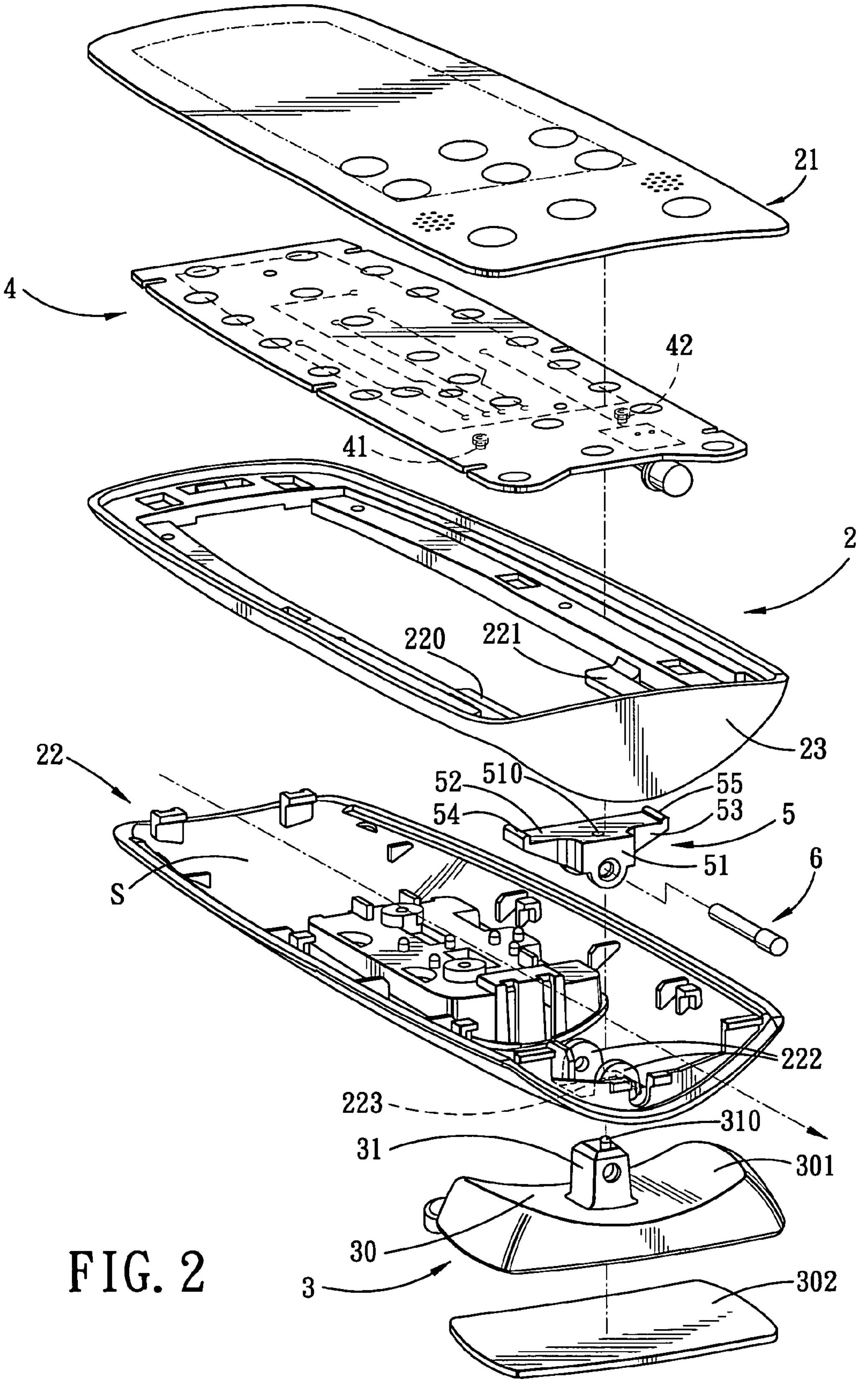
FIG. 2 is an exploded perspective view of the preferred embodiment of a remote controller according to the present invention.
Figure 3:
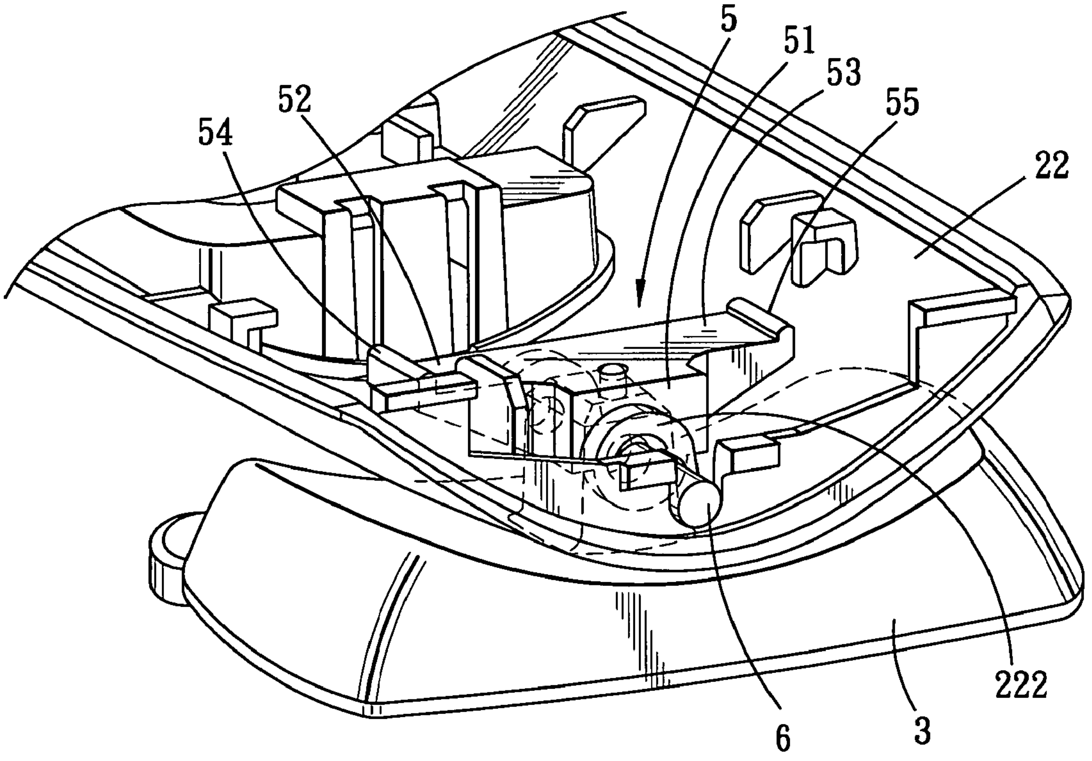
FIG. 3 is a fragmentary perspective view to illustrate an actuator of the preferred embodiment.

Referring to FIGS. 2 and 3, the preferred embodiment of a remote controller according to this invention is shown to include a casing 2, a support seat 3, an actuator 5, and a control circuit 4.

The remote controller is operable so as to transmit different control signals, e.g., channel and volume changing controls signals, that are to be received by an electronic device, e.g., a television set.

The casing 2 has a top cover 21, and a bottom cover 22 that has a convex surface and that cooperates with the top cover 21 of the casing 2 to define a circuit-accommodating space (S). The bottom cover 22 of the casing 2 is formed with a hole 223 that is in communication with the circuit-accommodating space (S) of the casing 2 and that is disposed between left and right sides of an end portion of the casing 2. The bottom cover 22 of the casing is provided with a pair of rings 222, each of which is disposed in the circuit-accommodating space (S) adjacent to a respective one of opposite sides of the hole 223 in the bottom cover 22 of the casing 2.

The support seat 3, which supports the casing 2, is disposed underneath the casing 2, and has a base 30 and a post 31. The base 30 of the support seat 3 has opposite concave and flat surfaces 301, 302. The concave surface 301 of the base 30 confronts, is spaced apart from, and has a curvature of radius larger than that of the convex surface of the bottom cover 22 of the casing 2. The flat surface 302 is laid on a horizontal surface (not shown) The post 31 extends upwardly from the concave surface 301 of the base 30, through the hole 223 in the bottom cover 22, and into the circuit-accommodating space (S) of the casing 2. The bottom cover 22 is pivotally seated on the post, in a manner that will be described hereinafter.

The actuator 5 is disposed in the circuit-accommodating space (S) of the casing 2. In this embodiment, the actuator 5 has a coupling portion 51 that is sleeved on the post 31 of the support seat 3, a pair of extending portions 52, 53, each of which extends from a respective one of opposite sides of the coupling portion 51, and a pair of actuating portions 54, 55, each of which extends from a respective one of the extending portions 52, 53.

The remote controller further includes a pivot joint 6 that pivotally couples the rings 222 of the casing 2, the post 31 of the support seat 3, and the coupling portion 51 of the actuator 5. In this embodiment, the pivot joint 6 permits the casing 2 to be tiltable relative to the support seat 3 from a horizontal position, where the left and right sides of the casing 2 are disposed at a substantially equal distance relative to the concave surface 301, to a first inclined position, where the left and right sides of the casing 2 are respectively disposed proximate to and distal from the concave surface 301. Tilting is also possible from the horizontal position to a second inclined position, where the left and right sides of the casing 2 are respectively disposed distal from and proximate to the concave surface 301.

It is noted that the coupling portion 51 of the actuator 5 is formed with an engaging groove 510, and the post 31 is formed with an engaging protrusion 310 that engages the engaging groove 510 in the coupling portion 51 of the actuator 5 when the coupling portion 51 is sleeved on the post 31 of the support seat 3. As such, the actuator 5 is prevented from moving in the circuit-accommodating space (S) of the casing 2.

The control circuit 4, which generates the control signals, is disposed in the circuit-accommodating space (S) of the casing 2. In this embodiment, the control circuit 4 is co-tiltable with the casing 2 relative to the actuator 5.

The remote controller further includes a frame 23 that is mounted in the casing 2. The control circuit 4 is mounted on the frame 23.

The remote controller further includes a transmitter circuit (not shown) that is coupled to the control circuit 4 and that is operable so as to transmit the control signals wirelessly.

The remote controller further includes a pair of left and right pressable switches 41, 42. In this embodiment, each of the left and right pressable switches 41, 42 corresponds to one of the control signals, is coupled to the control circuit 4, and is disposed in the circuit-accommodating space (S) above a respective one of the actuating portions 54, 55 of the actuator 5.

The remote controller further includes a pair of left and right elastic tabs 220, 221, each of which projects from the frame 23 and is disposed between a respective one of the left and right pressable switches 41, 42 and a respective one of the actuating portions 54, 55 of the actuator 5. It is noted that the left and right elastic tabs 220, 221 simply enhance the sensitivity of the left and right pressable switches 41, 42 to the actuating portions 54, 55, and may be dispensed with when the left and right pressable switches 41, 42 are aligned respectively with actuating portions 54, 55.

Figure 4:
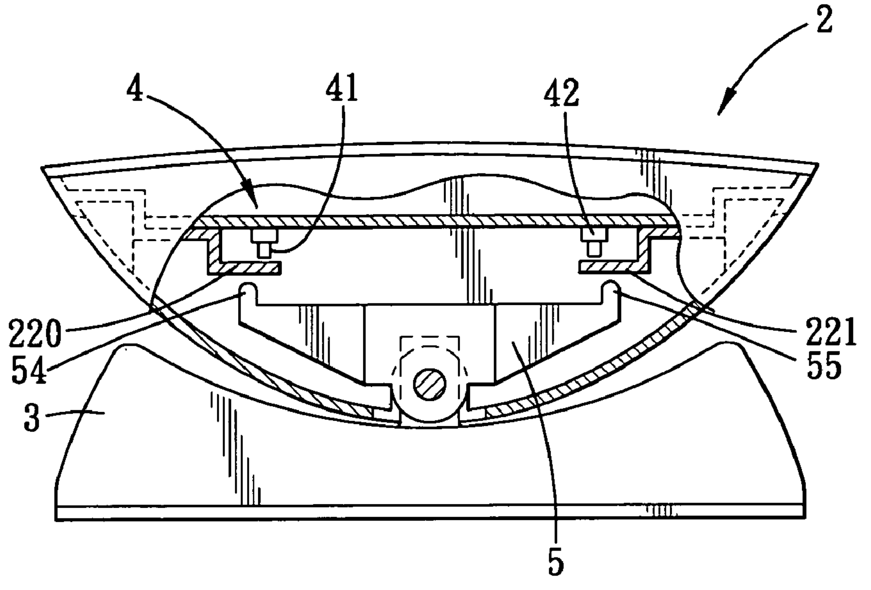
FIG. 4 is a sectional view to illustrate a state where a casing of the preferred embodiment is at a horizontal position.
Figure 5:
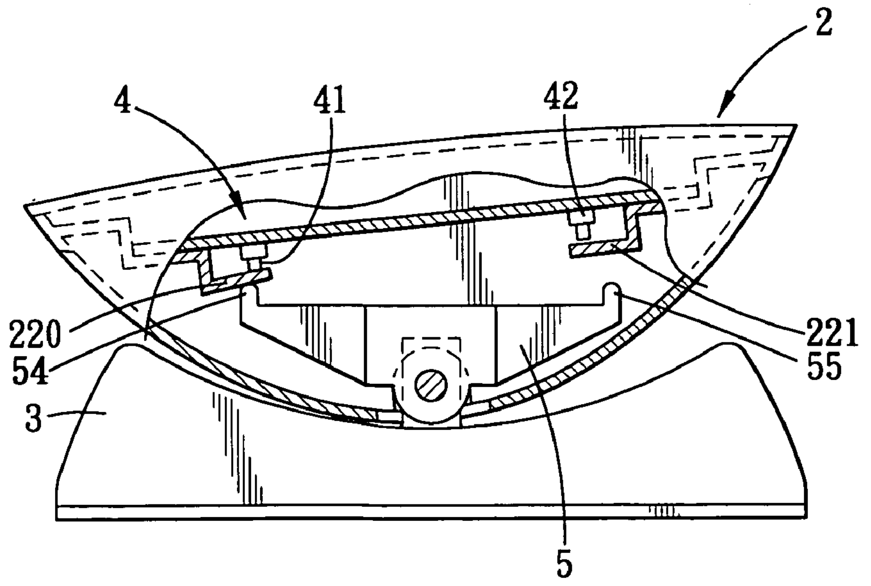
FIG. 5 is a sectional view to illustrate a state where the casing of the preferred embodiment is at a first inclined position.
Figure 6:
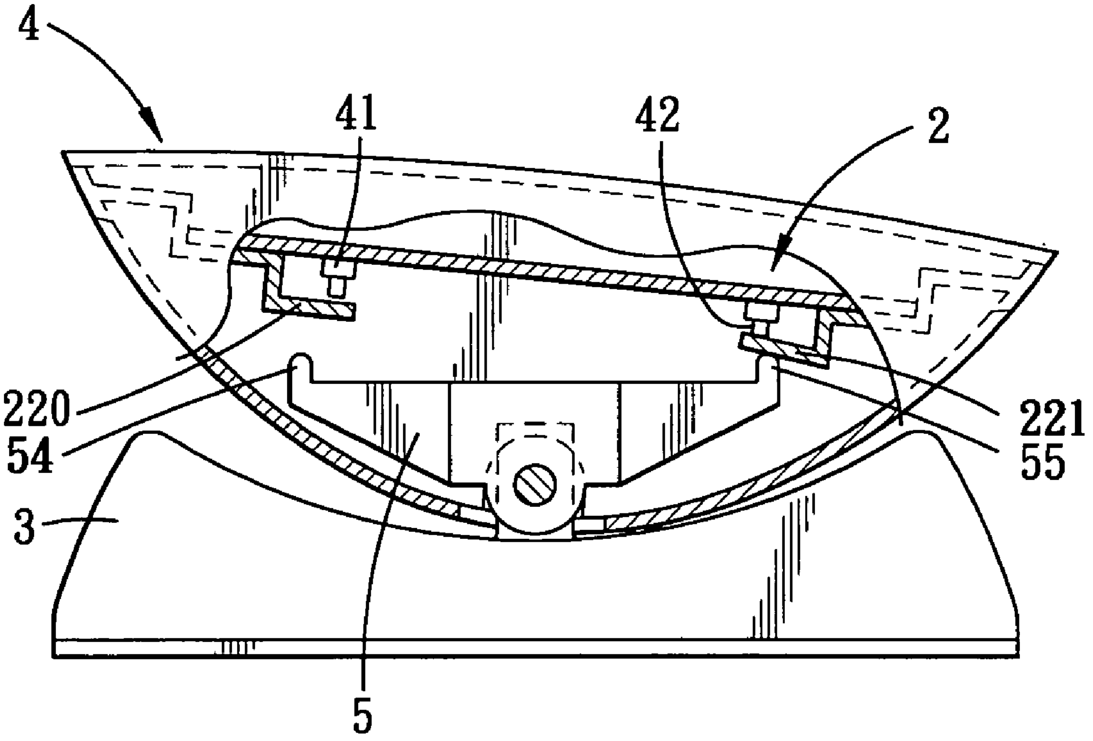
FIG. 6 is a sectional view to illustrate a state where the casing of the preferred embodiment is at a second inclined position.

In use, as illustrated in FIG. 4, when the casing 2 is at the horizontal position, each of the actuating portions 54, 55 of the actuator 5 is not in contact with the left and right tabs 220, 221. As illustrated in FIG. 5, when the casing 2 is disposed at the first inclined position, the actuating portion 54 presses the left elastic tab 220, which, in turn, elastically presses the pressable switch 41, thereby actuating the control circuit 4 so as to generate a corresponding one of the control signals. As illustrated in FIG. 6, when the casing 2 is disposed at the second inclined position, the actuating portion 55 presses the right elastic tab 221, which, in turn, elastically presses the pressable switch 42, thereby actuating the control circuit 4 so as to generate a corresponding one of the control signals.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A remote controller operable so as to transmit different control signals, comprising:

a casing;

a support seat having a base that is disposed underneath said casing and that is adapted to be laid on a horizontal surface, and a post that extends upwardly from said base through and into said casing and that is pivoted to said casing so as to permit said casing to be tiltable relative to said post from a horizontal position to an inclined position relative to said support seat;

an actuator mounted on said post within said casing; and a control circuit mounted in said casing for generating the control signals, said control circuit being co-tiltable with said casing relative to said actuator in such a manner that said control circuit is actuated by said actuator so as to generate a corresponding one of the control signals when said casing is disposed at said inclined position.

2. The remote controller as in claim 1, further comprising a pressable switch that corresponds to said one of the control signals, and that is coupled to said control circuit, said actuator pressing said pressable switch when said casing is disposed at said inclined position, thereby actuating said control circuit.

3. The remote controller as in claim 1, wherein said actuator has a coupling portion that is coupled to said post, an extending portion that extends from said coupling portion, and an actuating portion that extends from said extending portion, said actuating portions of said actuator pressing said pressable switch when said casing is at the inclined position.

4. The remote controller as in claim 1, wherein said casing has a bottom cover that has a convex surface.

5. The remote controller as in claim 3, wherein said base of said support seat has a concave surface that confronts, that is spaced apart from, and that has a curvature of radius larger than that of said convex surface of said bottom cover of said casing.

6. The remote controller as in claim 1, further comprising a pivot joint that pivotally couples said casing to said post of said support seat, thereby permitting said casing to be tiltable relative to said support seat.

7. The remote controller as in claim 2, further comprising a frame that is mounted in said casing, said control circuit being mounted on said frame.

8. The remote controller as in claim 7, further comprising an elastic tab that projects from said frame, that is spaced apart from said pressable switch when said casing is disposed at the horizontal position, and that is pressed by said actuator to elastically press said pressable switch when said casing is disposed at the inclined position, thereby actuating said control circuit.

* * * * *